(12) United States Patent
Meisel et al.

(10) Patent No.: US 10,555,088 B2
(45) Date of Patent: Feb. 4, 2020

(54) MEMS MICROPHONE SYSTEM HAVING AN ELECTRODE ASSEMBLY

(71) Applicants: Akustica, Inc., Pittsburgh, PA (US); Robert Bosch GmbH, Stuttgart (DE)

(72) Inventors: Daniel Meisel, Pittsburgh, PA (US); Bernhard Gehl, Wannweil (DE); Yujie Zhang, Sunnyvale, CA (US); Andrew Doller, Sharpsburg, PA (US); Gokhan Hatipoglu, Pittsburgh, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/816,332

(22) Filed: Nov. 17, 2017

(65) Prior Publication Data

US 2018/0146296 A1     May 24, 2018

Related U.S. Application Data

(60) Provisional application No. 62/423,966, filed on Nov. 18, 2016.

(51) Int. Cl.
*H04R 29/00* (2006.01)
*H04R 9/08* (2006.01)

(52) U.S. Cl.
CPC ......... *H04R 9/08* (2013.01); *H04R 2201/003* (2013.01)

(58) Field of Classification Search
CPC combination set(s) only.
See application file for complete search history.

(56) References Cited

U.S. PATENT DOCUMENTS

| 7,888,840 B2* | 2/2011 | Shimaoka | H04R 19/04 310/309 |
|---|---|---|---|
| 10,129,676 B2* | 11/2018 | Walther | B81C 1/00158 |
| 2008/0104825 A1* | 5/2008 | Dehe | H04R 19/005 29/594 |
| 2009/0080292 A1 | 3/2009 | Wagner et al. | |
| 2013/0001550 A1 | 1/2013 | Seeger et al. | |
| 2015/0001647 A1* | 1/2015 | Dehe | B81B 3/0021 257/416 |
| 2015/0289046 A1 | 10/2015 | Dehe et al. | |

FOREIGN PATENT DOCUMENTS

WO     2015142893 A1     9/2015

OTHER PUBLICATIONS

International Search Report corresponding to International Patent Application No. PCT/EP2017/079670 (4 pages).

* cited by examiner

*Primary Examiner* — Amir H Etesam
(74) *Attorney, Agent, or Firm* — Maginot, Moore & Beck LLP

(57) ABSTRACT

A microphone system includes first diaphragm element, second diaphragm element spaced apart from the first diaphragm element and connected to the first diaphragm element via a spacer. Disposed between the diaphragm elements is a plate capacitor element.

18 Claims, 18 Drawing Sheets

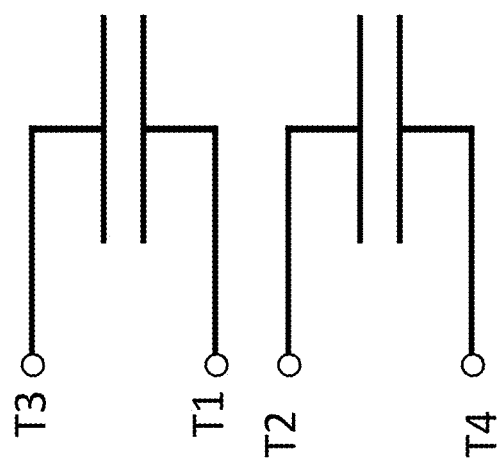

MEMS MICROPHONE SYSTEM HAVING AN ELECTRODE ASSEMBLY

FIELD

This disclosure relates generally to Microelectromechanical System (MEMS) devices and, more particularly, to MEMS microphone system having an electrode assembly.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to a MEMS microphone comprises a base unit and a driving system disposed on the base unit. The driving system comprises a carrier, a wall structure mechanically coupled the carrier to the base unit, and a plate counter electrode assembly mechanically coupled to the carrier, wherein the wall structure and the carrier defining a sealed electrode region and the plate counter electrode assembly is disposed within the sealed electrode region. The carrier comprising a first and second diaphragm, the first and second diaphragms are substantially made of a material having a low conductivity. The plate counter electrode assembly comprising a first movable electrode member and a second movable electrode member, the first and second movable electrode members are substantially made of a material having a conductivity. The first and second movable electrode members are mechanically coupled to the first and second diaphragm wherein one or more of the diaphragms are substantially made of a material having a tensile residual stress. The plate counter electrode assembly comprising a material having a tensile residual stress. The MEMS microphone system further comprises one or more pillar formed within the driving system and a leak hole is formed on at least one of the pillar.

According to another aspect of the disclosure, a driving system for a Microelectromechanical system (MEMS) microphone comprises a carrier having a first diaphragm, a second diaphragm spaced apart from the first diaphragm, and a gap formed between the first and second diaphragm. The driving system further comprises a plate counter electrode assembly formed within the first and second diaphragms, the plate counter electrode assembly comprises a moving electrode member, at least two counter electrode members, and a wall structure mechanically coupled the two counter electrode members to the first and second diaphragms defining a sealed electrode region, wherein the sealed electrode region having an encapsulated gas pressure and the plate counter electrode assembly is disposed within the sealed electrode region. The first diaphragm is substantially made of a material having a low conductivity and the second diaphragm is substantially made of a material having a low conductivity. The movable electrode member is substantially made of a material having a conductivity. One or more of the diaphragms are substantially made of a material having a tensile residual stress. The plate counter electrode assembly comprising a material having a tensile residual stress. In another embodiment, the plate counter electrode assembly comprises at least two counter electrodes formed within the sealed electrode region. The driving system comprises a connecting member mechanically coupled the counter electrode assembly to the first and second diaphragms. The driving system further comprises one or more pillar formed within the driving system and a leak hole formed on at least one of the pillar or the connecting member.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein:

FIG. 5B is a schematic diagram of the terminals of microphone die of FIG. 4A thereof;

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The disclosure is a microphone system for a client machine. Within the client machine are several other electronic components, such as sensor devices, speakers, graphical processor units, computer processor units, host systems, cameras, and any suitable computer implemented devices either directly or indirectly coupled to the microphone system. The client machine may be a voice-controlled device, a voice-assistant device, a personal computer or desktop computer, a laptop, a cellular or smart phone, a tablet, a personal digital assistant (PDA), a gaming console, an audio device, a video device, an entertainment device such as a television, a vehicle infotainment, a wearable device, an entertainment or an infotainment remote control, a thin client system, a thick client system, or the like. Other suitable client machines regardless of size, mobility, or configuration may be suggested to include any number of microphone systems.

The microphone system includes a package housing or an enclosure for housing any number of sensor devices/dies, internal components, or combination thereof. The sensor devices/dies may be such as MEMS transducers, speakers, receivers, microphones, pressure sensors, thermal sensors, optical sensors, imaging sensors, chemical sensors, gyroscopes, inertial sensors, humidity sensors, accelerometers, gas sensors, environmental sensors, motion sensors, navigation sensors, vital sensors, tunnel magnetoresistive (TMR) sensors, proximity sensors, bolometers, or combination thereof. The microphones may be electret microphones, capacitive microphones, graphene microphones, piezoelectric microphones, silicon microphones, optical microphones, or any suitable acoustic microphones.

Figure 1:
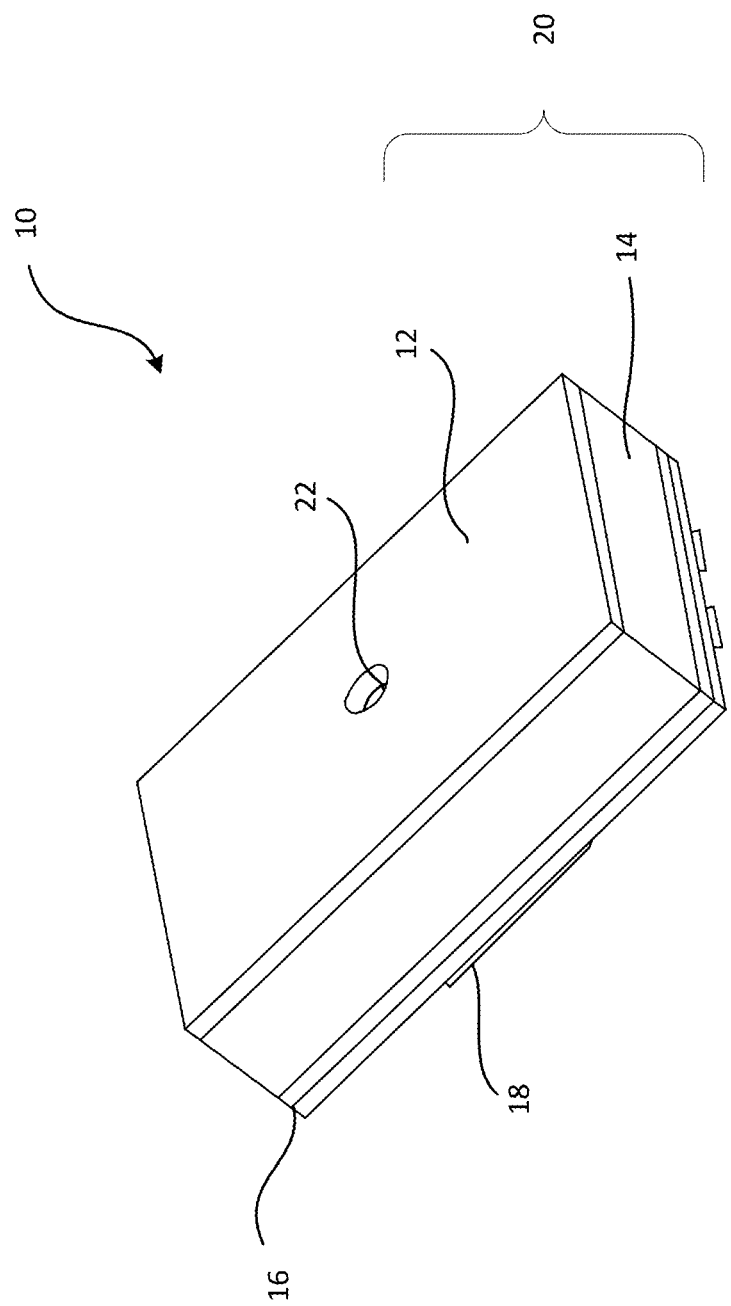
FIG. 1 is a perspective view of a microphone system in accordance with a described embodiments of a disclosure.
Figure 3A:
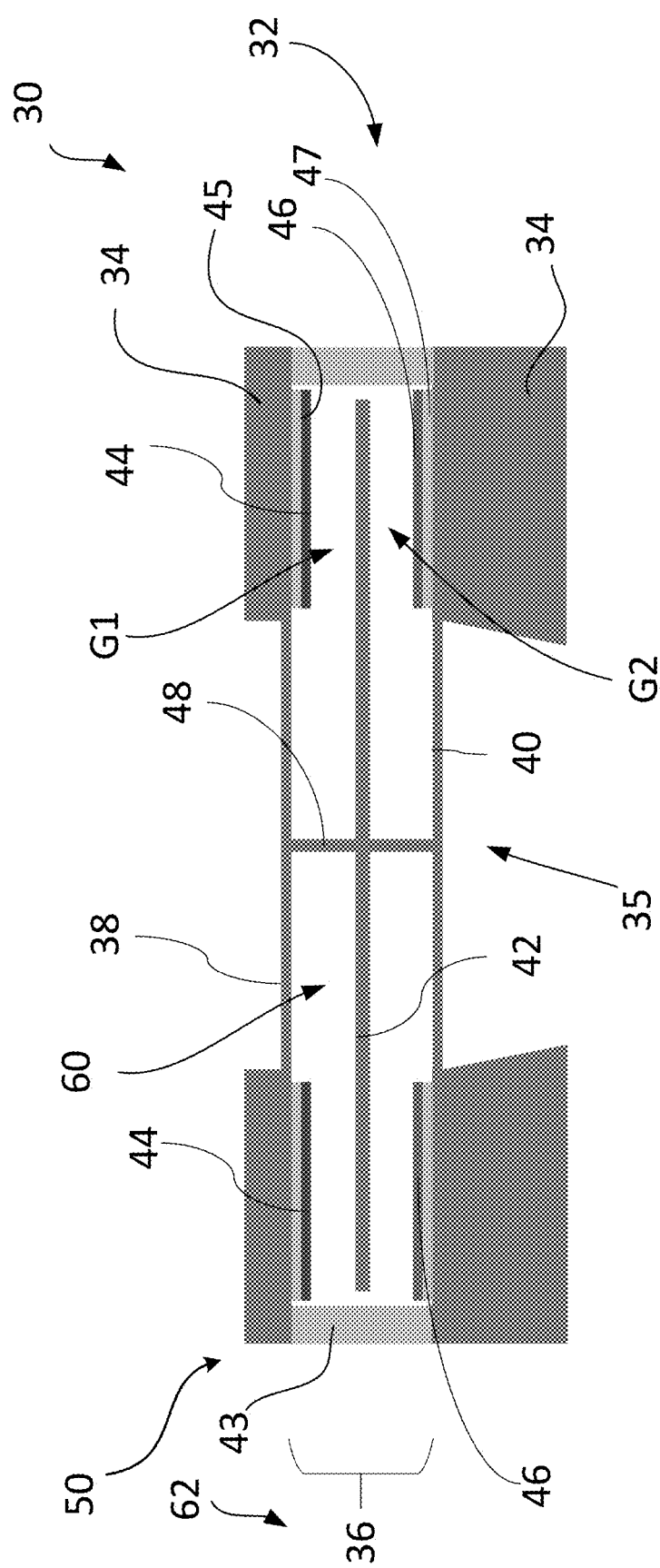
FIGS. 3A and 3B are cross-sectional views of a microphone die mounted within the microphone system of FIG. 1 in accordance with various described embodiments of the disclosure.

FIG. 1 is a perspective view of a MEMS microphone system 10 according to an embodiment of the disclosure. The MEMS microphone system 10 includes a package housing 20 having a lid 12, a spacer 14, and a substrate 16 attached to the spacer 14 by any suitable methods of attachment. More than one sensor device/die may be mounted within the microphone system 10. The sensor devices/dies may be MEMS transducers, speakers, receivers, microphones, pressure sensors, thermal sensors, optical sensors, imaging sensors, chemical sensors, gyroscopes, humidity sensors, inertial sensors, vital sensors, TMR sensors, accelerometers, gas sensors, environmental sensors, motion sensors, navigation sensors, proximity sensors, bolometers, or combination thereof. Optional components such as ASICs, integrated circuits, processors, controllers, energy storage devices, actuators, sensor circuits or any suitable circuitry may be mounted within the microphone system 10. Depending on the application, any number of opening 22 such as a port or a passageway for receiving attributes from an environment may be formed on any location of the package housing 20 by etching, piercing, drilling, punching, or any suitable methods. For example, the opening 22 may be formed either on the lid 12, the substrate 16, or the spacer 14. In some embodiments, the opening 22 may be formed on multiple locations of the package housing 20. The attributes may be acoustic signal, pressure signal, optical signal, gas signal, and any suitable signal. An optional barrier may be formed within the opening 22. The barrier is configured and functioned as a filter to remove debris, contamination, particles, vapor, fluid, or the like. In some embodiments, the barrier may formed on the outer surface of the housing 20 to cover the opening 22 so that debris, contamination, particles, or the like cannot penetrate into the housing. In yet another embodiments, the barrier may be formed below the opening 22 in which a portion of the barrier is attached to the inner surface of the housing 20 for filtering or removing debris, contamination, particles, or the like. In yet embodiments, the barrier may be fabricated directly onto the movable member such as a diaphragm. In yet another embodiment, the barrier is formed as a layered film or a layered material and may either be integrated into the housing 20 during fabrication, or disposed on the outer or inner surface of the housing 20. In further yet another embodiment, as illustrated in FIG. 3A, a barrier formed as a wall structure 43 coupled the top diaphragm member 38 to the bottom diaphragm member 40 for protecting the microphone against debris. The wall structure 43 will be further described below. Although one barrier is described, multiple layers of barrier or any suitable number of barrier may be implemented on the MEMS package, depending on the application. The barrier not only functions as the particle removal while exposed to the environment via the opening 22, the barrier can also serve other purposes such as a shock absorber, or a vibration damper, or combination thereof.

Although the microphone system 10 as depicted comprises a multi-structure package housing 20, various aspects and configurations either in a single structure package housing, a two piece structure package housing, or multi-structure package housing may be used to encapsulate at least one internal component. As an example, the lid 12 and the spacer 14 may be formed as a single structure, defines a cover or a cap. One or more bonding pads 18 may be formed on the substrate 18, the lid 12, the spacer 14, or multiple locations of the package housing 20 by any suitable method. Once bonding pads 18 are introduced, the microphone system 10 can be easily mounted to an external printed circuit board or another support member of the client machine. In some embodiments, the package housing further includes an interposer coupled the cover 12 to either the spacer 14 or the substrate 16.

Figure 2A:
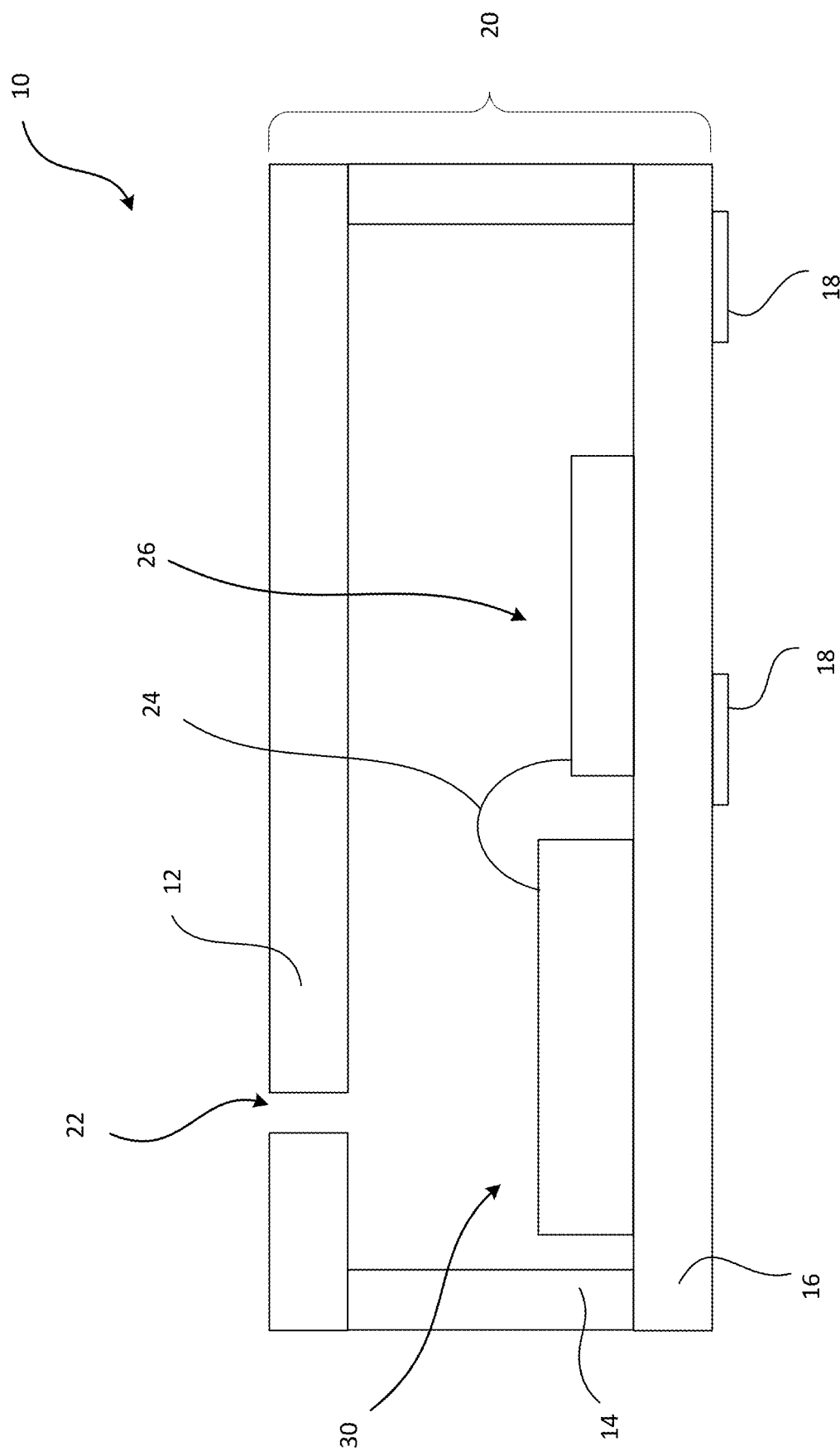
FIG. 2A is a cross-sectional view of the microphone system of FIG. 1 in accordance with a described embodiment of the disclosure.
Figure 2B:
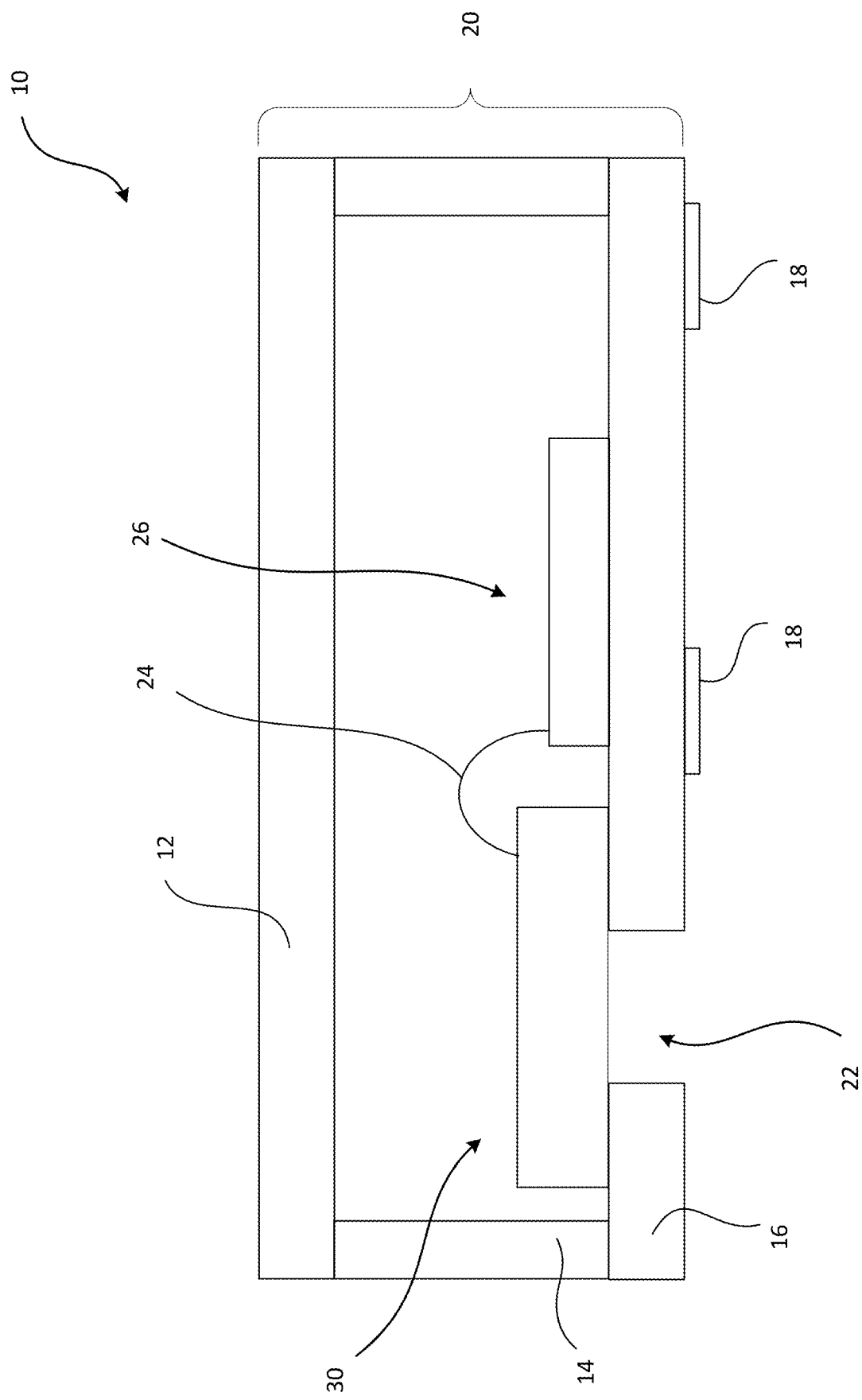
FIG. 2B is a cross-sectional view of another microphone system of FIG. 1 with a bottom port in accordance with a described embodiment of the disclosure.
Figure 2C:
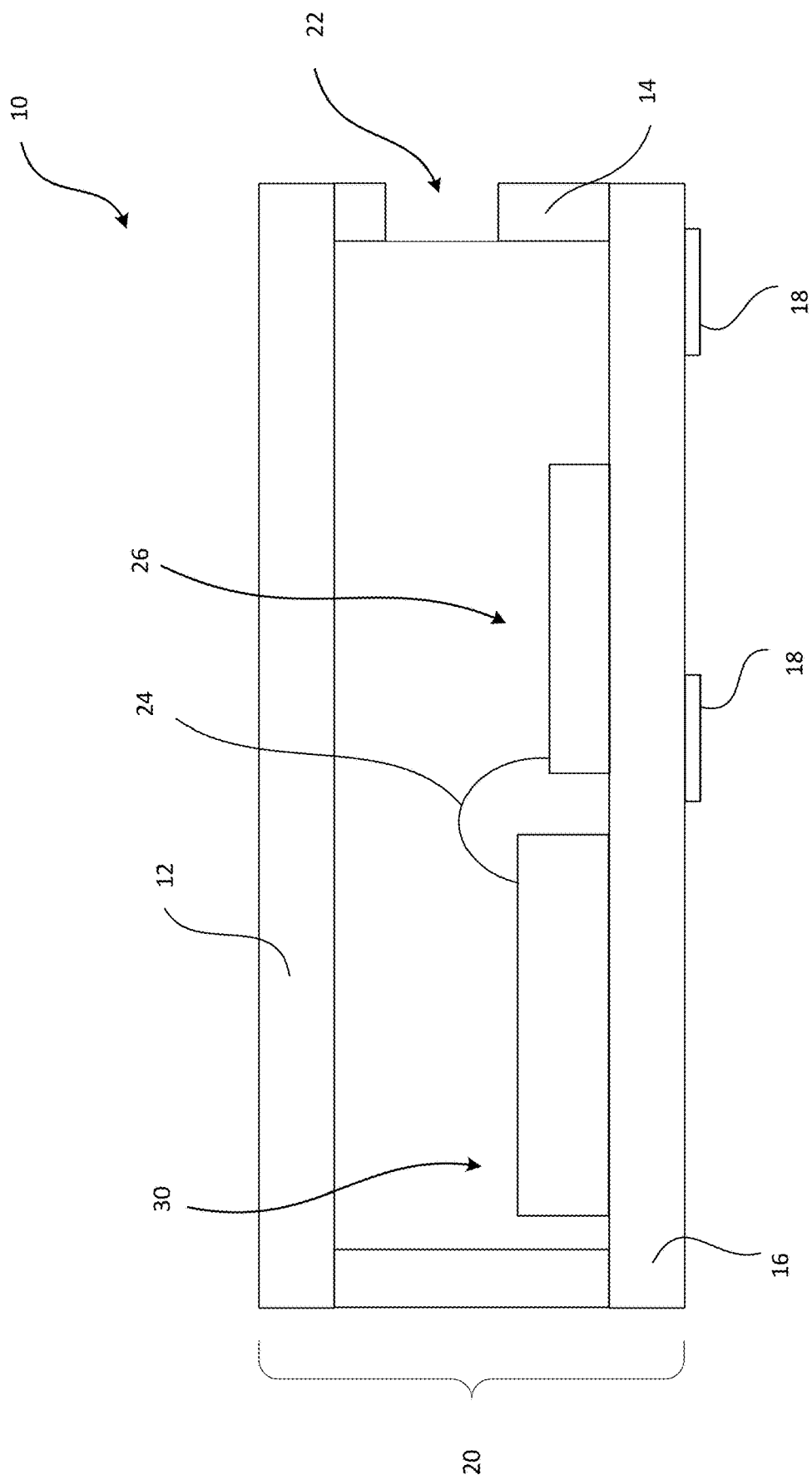
FIG. 2C is a cross-sectional view of another microphone system of FIG. 1 with a side port in accordance with a described embodiment of the disclosure.

FIGS. 2A-2C illustrate cross-sectional view of the microphone systems 10 of FIG. 1 having at least one opening 22 formed on various location of the packaging housing 20 in accordance with a described embodiment of the disclosure. The microphone system 10 includes a sensor device/die 30 and a component 26 mounted within any location of the package housing 20. An opening 22 formed on any location of the package housing 20 that is adjacent to at least one of the sensor device 30 or the component 26 to receive attributes or stimuli from external environment. A connection link 24 may be introduced to communicatively couple the sensor device 30 to the component 26. The connection link 24 may be wire bonding, solder-bump, solder microbump, solder ball, or any suitable connectors. In some embodiments, the connection link 24 may be a wireless communication link and the sensor device 30 is communicatively coupled to the component 26 with built-in interfaces formed in both sensor device 30 and the component 26. The wireless communicative link, for example, may be WiFi, near field communication (NFC), Zigbee, Smart WiFi, Bluetooth (BT) Qi wireless communication, ultra-wide band (UWB), cellular protocol frequency, radio frequency, or any suitable communication link. Depending on the applications, any number of sensor devices 30, components 26, or connection links 24 between the sensor devices and the components may be used. Although side-by-side configuration of the component 26 and the sensor device 30 is illustrated in FIG. 1, any suitable configurations may be possible. For example, the sensor device 30 may be placed or mounted on top of the component 26 to form a stacked configuration. In another example, an optional hole is formed within the component 26 and is configured to receive the sensor 30 and surround the sensor device 30.

FIG. 3A illustrates a cross-sectional view of a microphone die 30 mounted within the microphone system 10 of FIG. 1 in accordance with an exemplary embodiment of the disclosure. The microphone die 30 includes a driving system 32 mounted on a base unit 34, such as a substrate. Within the driving system 32 includes an electrode assembly 50 and a plate counter electrode assembly 36 insulated from the electrode assembly 50. In one embodiment, the electrode assembly 50 is a movable electrode member assembly such as a diaphragm and the plate counter electrode assembly 36 is a combo diaphragm and back plate counter electrode assembly. The diaphragm electrode assembly 50 includes a top diaphragm 38 (also referred to as first diaphragm element) and a bottom diaphragm 40 (also referred to as second diaphragm element) spaced apart from the top diaphragm 38. Although two diaphragms 38, 40 are illustrated, any number of the diaphragms 38, 40 may be removed or added to the microphone die 30 without scarifying the performance of the microphone die 30. Between the top and bottom diaphragms 38, 40 is the plate counter electrode assembly 36 and includes a top plate counter electrode element 44, a bottom plate counter electrode element 46, and an intermediate plate counter electrode element 42. An electrostatic gap G1 separates the intermediate plate counter electrode element 42 from top plate counter electrode element 44 is provided. An electrostatic gap G2 separates the intermediate plate counter electrode element 42 from bottom plate counter electrode element 46 is provided. In some embodiments, only one plate counter electrode element is provided. The top plate counter electrode element 44 and the bottom plate counter electrode element 46 may also be referred to as top stationary electrode member 44 and bottom stationary electrode member 46. The intermediate plate counter electrode element 42 may also be referred to as moving electrode member 42.

The diaphragm electrode assembly 50 includes a first diaphragm element 38, second diaphragm element 40 spaced apart from the first diaphragm element 38 and connected to the first diaphragm element 38 via a pillar 48. Although one pillar 48 is illustrated, more than one pillar 48 may be implemented and formed between the diaphragm electrode assembly 50. An optional through hole such as a leak hole or a piercing hole structure may be formed within the pillar 48. An optional plate capacitor element 42 may be disposed between the diaphragm electrode assembly, however, the plate capacitor element 42 does not require in certain microphone dies configuration. In one embodiment, the diaphragm elements 38, 40, the pillar 48, and the plate capacitor element 42 may form an integral structure of the same material. In another embodiment, the pillar 48 and the plate capacitor element 42 may be integrally formed. Both ends of the pillar 48 are then attached to the diaphragm elements 38, 40 by any suitable attachment methods. The pillar 48 may be made of insulating or conductive material. In yet another embodiment, the pillar 48 and the diaphragm elements 38, 40 may be integrally formed and the plate capacitor element 42 formed in two sub-plate capacitor elements is attached to either body portion or outer-surface of the pillar 48 by any suitable attachment methods. In further another embodiment, a first spacer and the first diaphragm element 38 may form an integral structure. Similarly, a second spacer and the second diaphragm element 40 may form an integral structure. End portion of the first spacer is attached to a first surface of the plate capacitor element 42. Likewise, end portion of the second spacer is attached to a second surface of the plate capacitor element 42. In some embodiments, two plate capacitor elements may be separately provided and each plate capacitor element includes a spacer integrally formed therein. End portions of the spacers opposed to the plate capacitor elements may be attached to first and second diaphragm elements 38, 40 after the two plate capacitor elements are attached or laminated to form a single plate capacitor element 42. A wall structure 43 may be formed around circumferential portions of the diaphragm elements 38, 40. Located at outer inner surfaces of the diaphragm elements 38, 40 adjacent to the wall structure 43 are first and second diaphragm isolations 45, 47.

As illustrated in FIG. 3A, the first diaphragm isolation 45 is formed on inner surface of the first diaphragm element 38 by any suitable method of fabrications. Similarly, the second diaphragm isolation 47 is formed on inner surface of the second diaphragm element 40 by any suitable method of fabrications. In one embodiment, the first and second diaphragm isolations 45, 47 may be spaced apart from the wall structure 43. In another embodiment, the first and second diaphragm isolations 45, 47 and the wall structure 43 may integrally formed as a single isolator structure. In yet another embodiment, the first diaphragm isolation 45 and the wall structure 43 may be integrally formed. In further embodiment, the second diaphragm isolation 47 and the wall structure 43 may integrally formed. First and second electrode elements 44, 46 may be provided between the diaphragm elements 38, 40. As illustrated in FIG. 3A, the first electrode element 44 opposed to the first diaphragm element 38 is attached to the first diaphragm isolation 45 by any suitable method of attachments. Similarly, the second electrode element 46 opposed to the second diaphragm element 40 is attached to the second diaphragm isolation 47 by any suitable method of attachments. In one embodiment, the first and second electrode element 44, 46 may be spaced apart from the wall structure 43. In another embodiment, the first and second electrode element 44, 46 coupled or attached to the first and second diaphragm isolations 45, 47, respectively also and may be coupled or attached to the wall structure 43. In yet another embodiment, the first electrode element 44 coupled or attached to the first diaphragm isolation 45 may be spaced apart from the wall structure 43 whereas the second electrode element 46 coupled or attached to the second diaphragm isolation 47 may be coupled or attached to the wall structure 43. Vice versa, in some embodiments, the first electrode element 44 coupled or attached to the first diaphragm isolation 45 may be coupled or attached to the wall structure 43 whereas the second electrode element 46 coupled or attached to the second diaphragm isolation 47 may be spaced apart from the wall structure 43. In the example of the microphone die 10 depicted in FIG. 3A, the plate capacitor element 42 is sandwiched and spaced apart from the wall structure 43, electrode elements 44, 46, and the diaphragm elements 38, 40. In one embodiment, first gap G1 may be formed between the first diaphragm element 38, first diaphragm isolation 45, the first electrode element 44, and the plate capacitor element 42. In one embodiment, second gap G2 may be formed between the second diaphragm element 40, second diaphragm isolation 47, the second electrode element 46, and the plate capacitor element 42. At least one substrate 34 may be formed on at least one of the first and second diaphragm elements 38, 40. In one embodiment, the substrate 34 may be formed on outer surface portion of the second diaphragm element 40. In another embodiment, the substrate 34 may be formed on outer surface portion of the first diaphragm element 38. An opening 35 below the second diaphragm element 40 may be formed on the substrate 34 to receive sound pressure. If a second substrate similar to the substrate 34 is provided and formed above the first diaphragm element 38, a second opening for receiving sound pressure may be formed on the substrate.

Now returning back to FIG. 3A, the wall structure 43 couples the first diaphragm element 38 to the second diaphragm element 40 which forms an inner region or an electrode region 60, collectively. Such formation separates the inner region 60 from an outer or an ambient region 62 that is located outside the driving system 32. In doing so, a sealed cavity defined by the inside region 60 is formed.

In one embodiment, the inner region 60 and the outer region 62 are gas pervious and debris impervious by using a gas pervious and debris impervious material to form 38, 40, or 43. The material for example includes a porosity which allows gas to flow easily/freely within the regions 60, 62 while blocking or preventing debris penetration. Pressure in the inner region 60 is substantially the same as the pressure in the outer region 62.

In another embodiment, the inner region 60 and the outer region 62 are gas impervious and debris impervious by using a material that is gas impervious and debris impervious for 38 and 40 and 43. The pressure in the inner region 60 may be substantially the same as or different from the outer region 62. For example, the pressure in the inner region 60 can be higher or lower than the pressure in the outer region 62. Depending on the surroundings, the pressure in the electrode region 60 and the ambient region 62 may be substantially the same, above, or lower than an atmospheric pressure. In some other surroundings, the pressure in the electrode region 60 may be lower than the pressure in the ambient region 62, whilst the pressure in both regions 60, 62 may be lower or higher than the atmospheric pressure. In yet another surrounding, the pressure in the electrode region 60 may be higher than the pressure in the ambient region 62, whilst the pressure in both regions 60, 62 may be lower or higher than the atmospheric pressure.

The driving system 32 is assembled in a closed chamber with a defined atmosphere. The defined atmosphere includes certain mixture of gasses at a certain pressure and temperature. The gas may be monatomic gas or diatomic gas. For example, the gas is helium, neon, argon, krypton, xenon, radon, hydrogen, oxygen, nitrogen, carbon monoxide. In some example, the gas may have a low viscosity such as methane, ethane, and ammonia. At least one or more combined gaseous substances or gas may be introduced during the assembly stage. Within the electrode region 60, after the assembly is completed, a defined state of the gas is encapsulated. The pressure of the gas found in the electrode region 60 can be between 0.0001 and 1.0 bar, between 0.001 and 0.05 bar, below 0.0001 bar, above 0.05 bar, for instance. Now the defined state of the gas having a pressure of the described range is introduced in the electrode region 60, the artifact noise is significantly reduced which then improves the acoustic signal produced by the driving system 32.

The driving system 32 may be formed from a material such as silicon, silicon nitride, silicon carbide, silicon oxide, grapheme, dielectric, polymer, metal or any other suitable material. In one embodiment the diaphragms 38 and 40 are substantially made of a low conductive material or insulating material (e.g. 1–1E22 Ohm*cm) such as e.g. silicon nitride, the wall structure 43 is substantially made of a low conductive material or insulating material such as e.g. silicon dioxide or silicon nitride, the pillar 48 is substantially made of a low conductive material or insulating material such as e.g. silicon dioxide or silicon nitride, the electrode elements 42, 44, and 46, are substantially made of a conductive material such as e.g. silicon or doped silicon, the base or substrate 34 is substantially made of a conductive material or semi-conductive material or low conductive material or insulating material such as e.g. silicon or silicon dioxide.

In one embodiment the diaphragms 38 and 40 are substantially made of or contain a material having a tensile stress or a tensile residual stress of e.g. 0.1-2000 MPa, or 0.1-10 MPa, or 10-50 MPa, or 50-100 MPa, or 100-300 MPa, or 300-2000 MPa. In one embodiment the diaphragms 38 and 40 are substantially made of low stress nitride (LSN) having a tensile residual stress of 1-100 MPa. In one embodiment the thickness of the diaphragms 38 and 40 is in the range of 0.1-5 micrometer. In on embodiment the diaphragms 38 and 40 and the pillar 48 contain runners made of conductive material to electrically contact the plate capacitor element 42 to a bond pad at the periphery of the MEMS chip.

When the sound waves passes through the opening 22 of the microphone system 10 of FIGS. 1 and 2A-2C, the sound waves impinge on the driving system 32 causes the driving system 32 to flex, i.e. vibrate up and down. Such movement of the driving system 32 creates a change in the amount of gap or distance between the electrodes which is translated into a change in capacitance which is translated into an electrical signal by the component 26, i.e. ASIC. The ASIC then measures the at least one of voltage/charge/current variations caused when the capacitance changes due to the motion of the driving system 32 in response to sound waves.

Figure 3B:
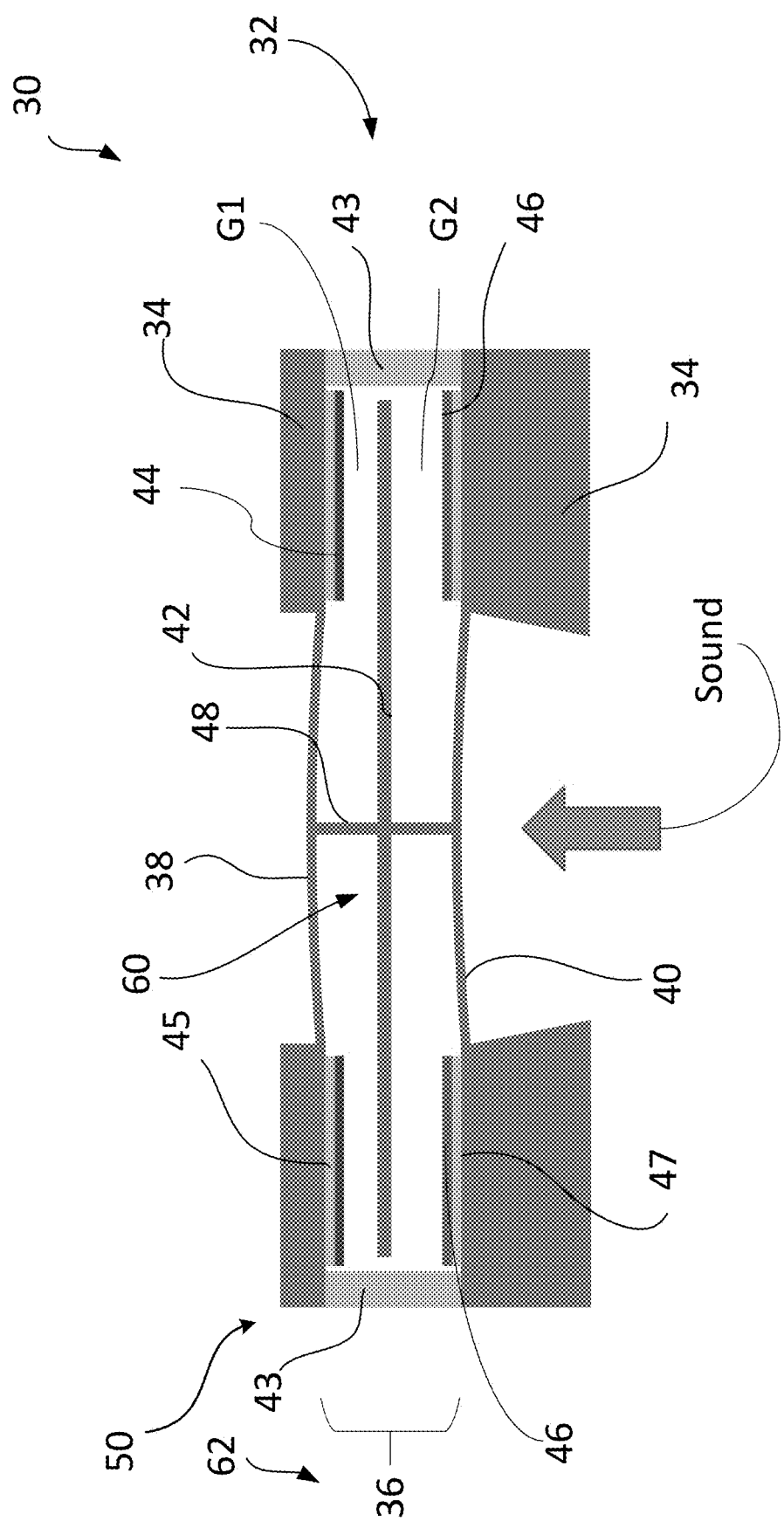

Now referring to FIG. 3B, as the sound pressure imping on the second diaphragm element 40, the second diaphragm element 40 oscillates or deforms in response to the sound pressure. This oscillation movement of the second diaphragm element 40 which in turn causes the pillar 48 having one end coupled to the second diaphragm element 40 to oscillate in the same direction. The pillar 48 having a second end coupled to the first diaphragm element 38 also oscillates in the same direction as the second diaphragm element 40. The plate capacitor element 42 oscillates in the same direction as the diaphragm elements 38, 40 and the pillar 48 as well since the plate capacitor element 42 is coupled to the diaphragm element 40 via the pillar 48. The gaps G1, G2 change due to the sound waves acting on the second diaphragm element 40 which results in a change in capacitance between the plate capacitor element 42 and the first electrode element 44 within G1 and between the plate capacitor element 42 and the second electrode element 46 within G2. An electrical circuit system coupled to electrode elements 44, 46 converts the change of capacitance into an electrical signal.

Figure 3C:
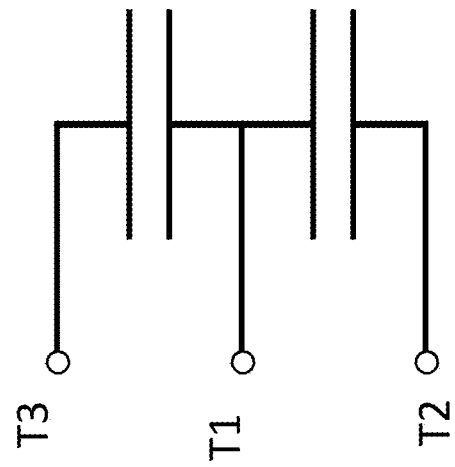
FIG. 3C is a schematic diagram of the terminals of microphone die of FIGS. 3A and 3B thereof.

FIG. 3C illustrates a schematic diagram of the microphone die 30 of FIGS. 3A and 3B having three-terminal configuration. First terminal T1 is connected to the plate capacitor element 42, second terminal T2 is connected to the electrode element 46, and third terminal T3 is connected to the electrode element 44. The terminals T1, T2, T3 are communicatively and electrically coupled to an external circuitry. In some embodiments, the terminals T1, T2, T3 may be bias terminal, output terminal, respectively. The microphone die 30 having a three-terminal configuration defines as a differential microphone and provide an improved common mode rejection. In addition, the differential microphone 30 may include higher signal to noise ratio (SNR) and higher acoustic overload point (AOP).

MEMS sensor with various polarity configurations may be introduced for several reasons. In one embodiment, a MEMS sensor includes a polarity configuration with different potential for biasing top and bottom electrode elements 44, 46. In another embodiment, a MEMS sensor includes a polarity configuration having different or opposite polarity and is configured to collect noise signal while the signals produced by top and bottom electrode elements 44, 46 either cancelled out, combining the resulted signal value received from the top and bottom electrode elements 44, 46, or subtracting the resulted signal value received from top and bottom electrode elements 44, 46. In yet another embodiment, a MEMS sensor includes a polarity configuration having identical polarity and is configured to readout signal produced by the top and bottom electrode elements 44, 46. In further yet another embodiment, a MEMS sensor includes an alternating polarity configuration with either identical or different/opposite polarity to perform at least one of the above-described functions.

Figure 4A:
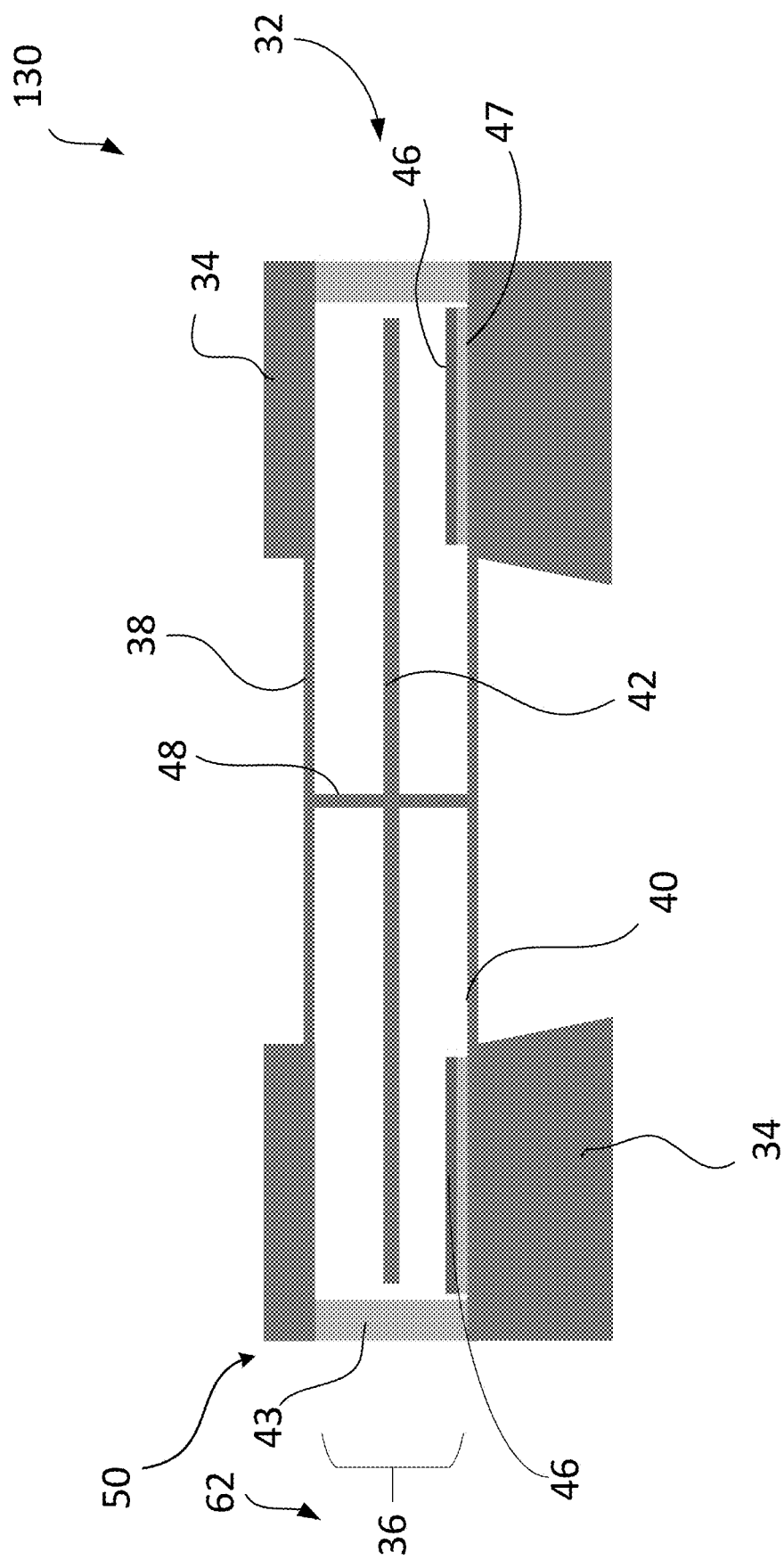
FIG. 4A is a cross-sectional view of a microphone die in accordance with another exemplary embodiment of the disclosure.
Figure 4B:
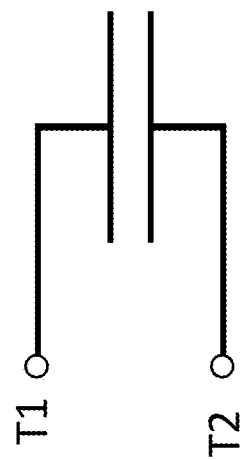
FIG. 4B is a schematic diagram of the terminals of microphone die of FIG. 4A thereof.

FIGS. 4A and 4B illustrate another microphone die 130 having two-terminal configuration of the disclosure defines as a single-ended microphone. The microphone die 130 is similar to the microphone die 30 illustrated in FIGS. 3A-3C except the microphone die 130 includes only one electrode element 46 formed on and isolated from the second diaphragm element 40 via an insolation 47. First terminal T1 is connected to the plate capacitor element 42 and the second terminal T2 is connected to the electrode element 46. In one embodiment, the first terminal T1 connected to the plate capacitor element 42 is a bias terminal. In another embodiment, the first terminal T1 connected to the plate capacitor element 42 is an output terminal. Similarly, if the first terminal T1 connected to the plate capacitor element 42 is a bias terminal, then the second terminal T2 connected to the electrode element 46 is the output terminal. In some embodiments, the output terminal is communicatively and electrically coupled to an external circuitry. The output of the common mode rejection, SNR, and AOP of the single-ended microphone die 130 may be lower than the output of the differential microphone, the single-ended microphone only requires a smaller footprint of an ASIC.

Figure 5A:
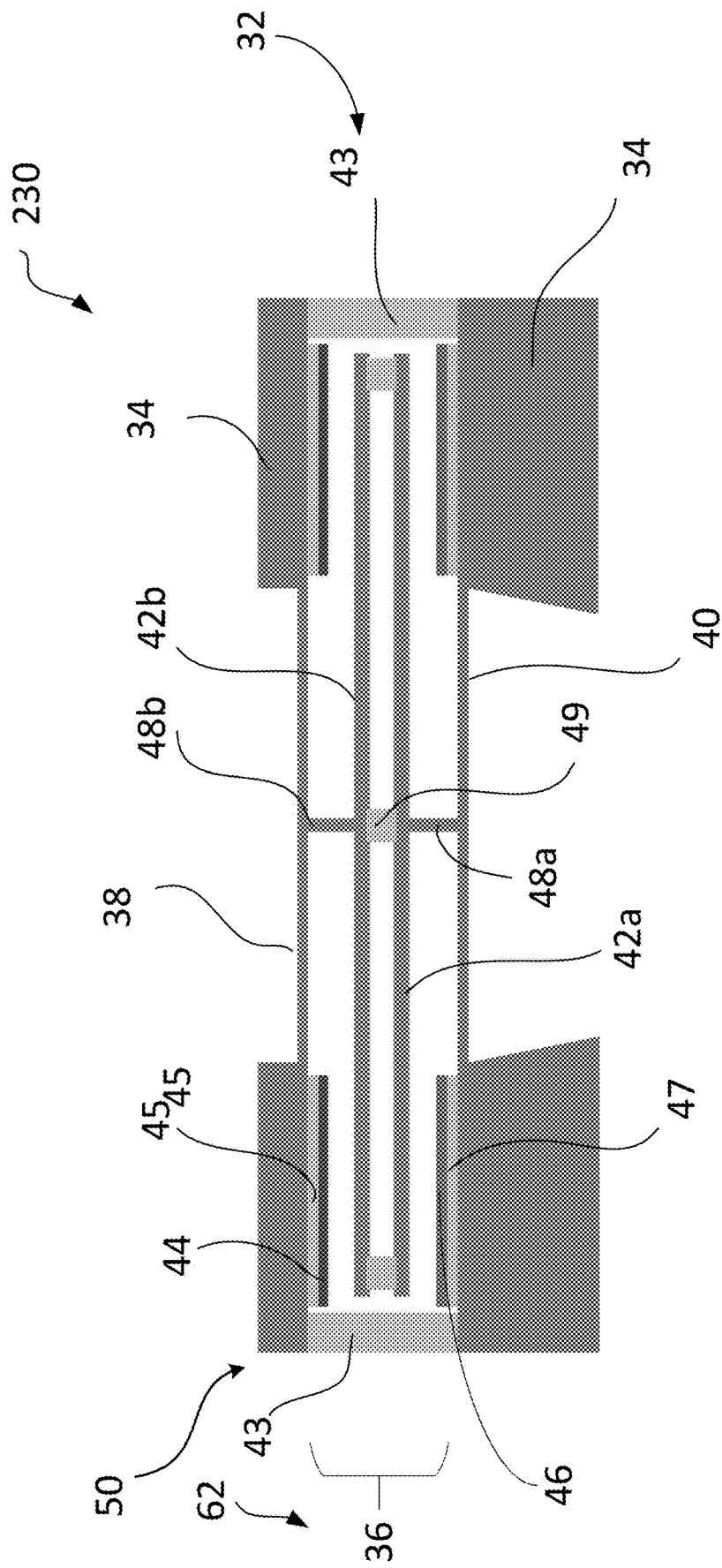
FIG. 5A is a cross-sectional view of a microphone die in accordance with another exemplary embodiment of the disclosure.

FIGS. 5A and 5B illustrate another microphone die 230 having two-terminal configuration of the disclosure defines as a single-ended microphone. The microphone die 230 is similar to the microphone die 30 illustrated in FIGS. 3A-3C except the microphone die 230 includes plate capacitor elements 42a, 42b spaced apart from each other via spacer/connecting member 49. As depicted in FIG. 5A, the spacer/connecting member 49 such as bumps, posts, or the like located between the plate capacitor elements 42a, 42b may be formed on the circumferences region and center region of the plate capacitor elements 42a, 42b. In one embodiment, the spacer/connecting member 49 is formed in a form of a film, or a coating may be formed between the plate capacitor elements 42a, 42b and to connect the plate capacitor elements 42a, 42b with each other. In one embodiment the spacer/connecting member 49 is made of an insulating material to electrically isolate and mechanically couple plate capacitor elements 42a, 42b with each other. In another embodiment the spacer/connecting member 49 is made of a conductive material to mechanically and electrically couple plate capacitor elements 42a, 42b with each other.

Now referring to FIG. 5B, two terminals T1, T2 are connected to the plate capacitor elements 42a, 42b, respectively. Third terminal T3 is connected to the electrode element 44 whereas fourth terminal T4 is connected to the electrode element 46. One or more terminals T1-T4 are communicatively and electrically coupled to an external circuitry. The terminals T1-T4 may be output terminals, bias terminals, ground terminals, or combination thereof. T1-T4 terminal combinations can be used to utilize differential output, reduce parasitic capacitance, RF shielding and allow different ASIC structures to be connected at the output end of the microphone die.

Figure 6A:
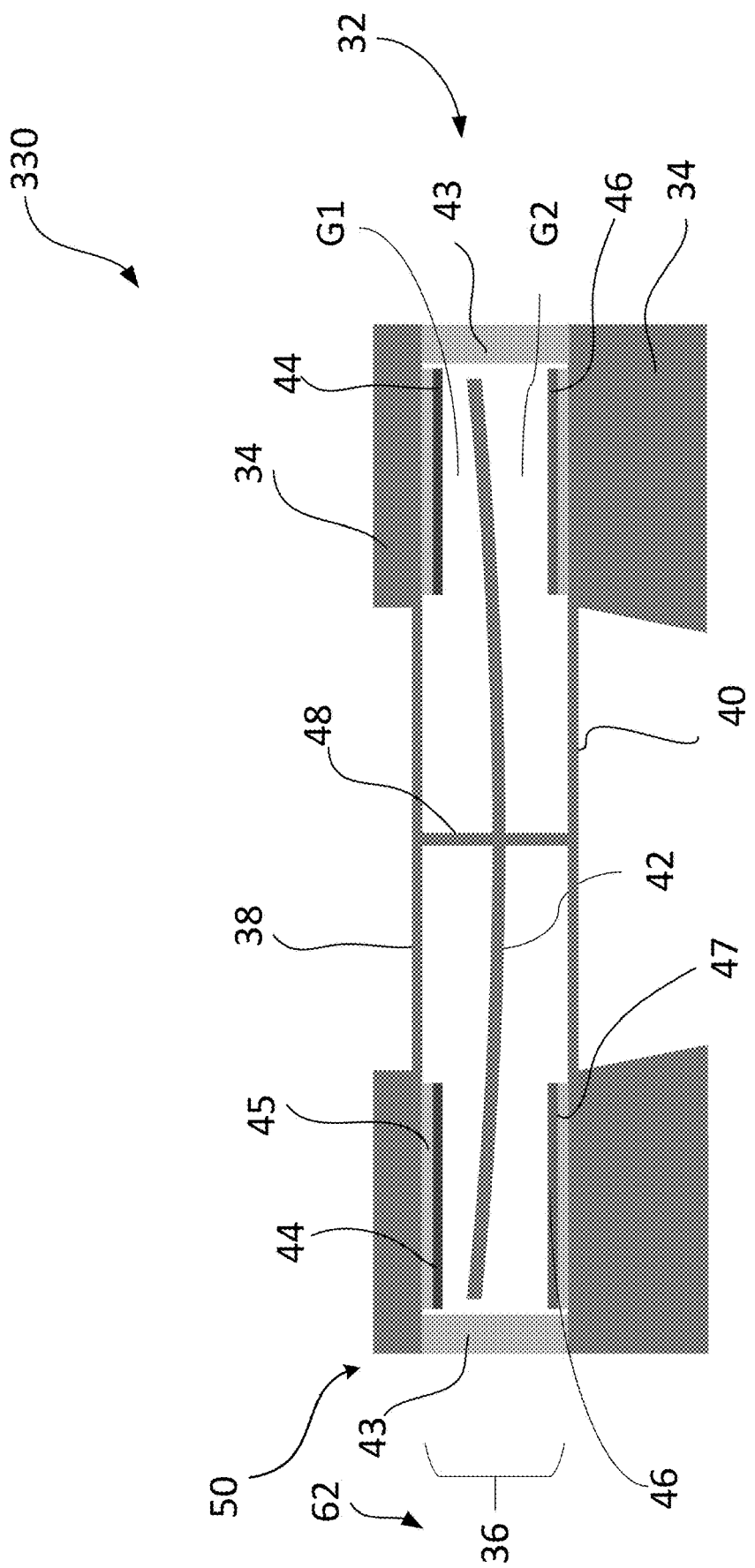
FIG. 6A is a cross-sectional view of a microphone die in accordance with another exemplary embodiment of the disclosure.
Figure 6B:
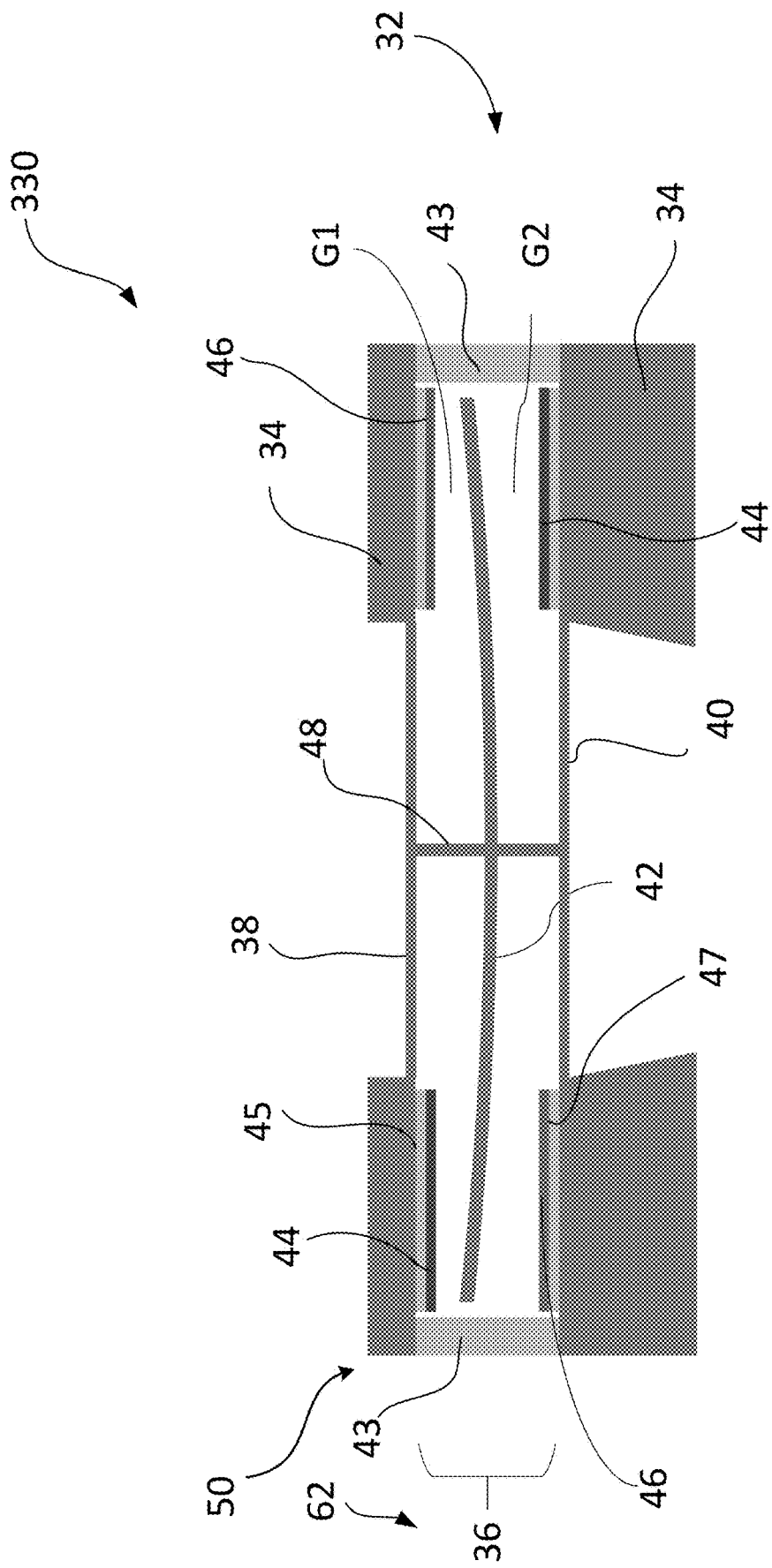
FIG. 6B is a cross-sectional view of a microphone die in accordance with another exemplary embodiment of the disclosure.
Figure 6C:
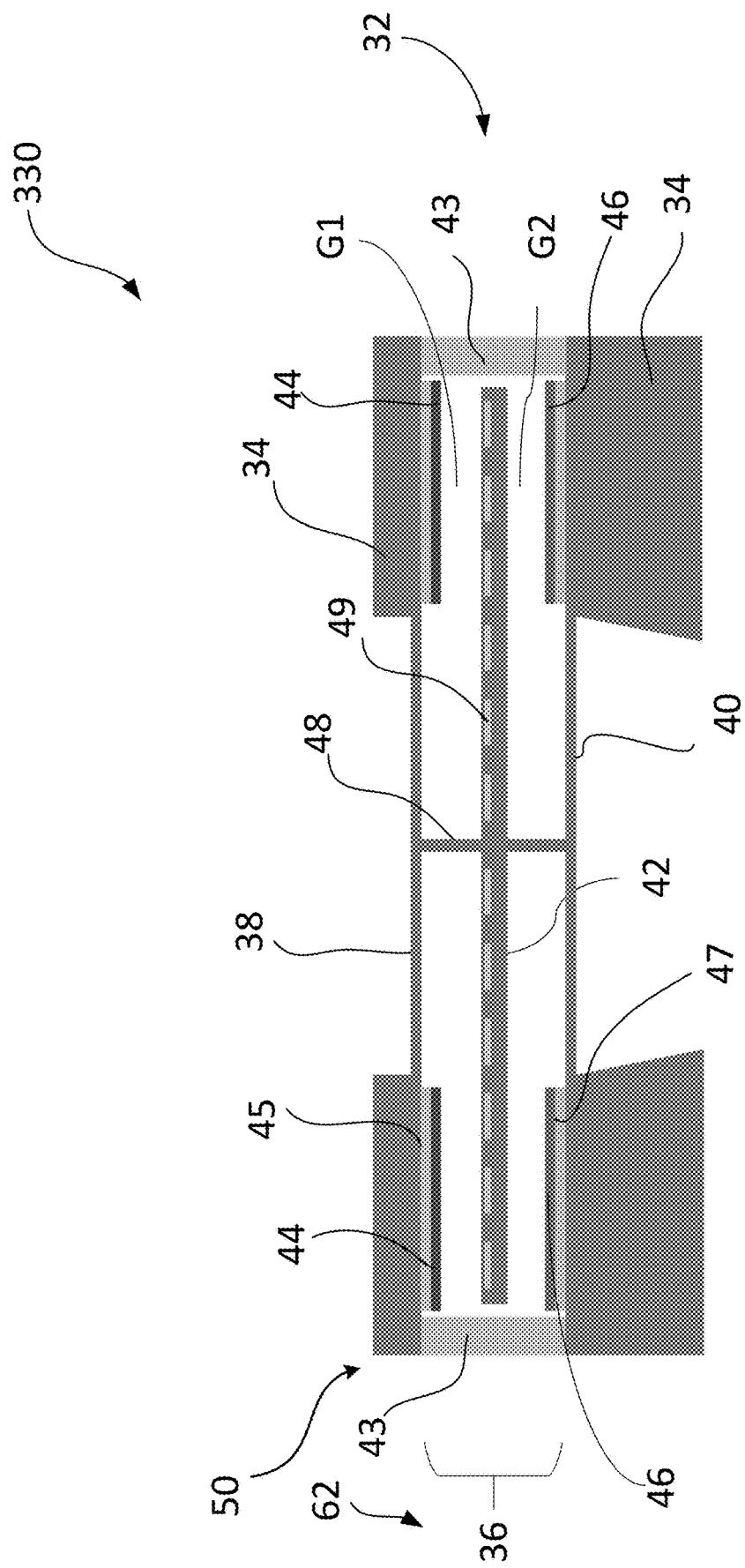
FIG. 6C is a cross-sectional view of a microphone die in accordance with another exemplary embodiment of the disclosure.

FIGS. 6A-6C illustrate various exemplary embodiment of microphone die 330 of the disclosure. At least one terminal may be coupled to the microphone die 330 in suitable terminal configuration, as described in previous embodiments. The microphone die 330 is similar to the microphone die 30 illustrated in FIGS. 3A-3C except the microphone die 330 includes a stress gradient in the plate capacitor element 42 at rest position. When the length of the plate capacitor increases or above a threshold or the thickness of the plate capacitor decreases or below a threshold, the capacitor element 42 may either bent upward toward the first diaphragm element 38 or downward toward the second diaphragm element 40. The stress gradient produces at a bending moment in the plate capacitor element 42 thereby causes the plate capacitor element 42 to bend. For example, gap G1 formed between the first electrode element 44 and the plate capacitor element 42 depending on the bending direction is not equal to the gap G2 formed between the second electrode element 46 and the plate capacitor element 42 due to the stress gradient and high electric field in the plate capacitor element 42 at rest position which results in an offset between the two electrode elements 44 and 46 and a smaller allowable or limited displacement of the moving element 42 due to possible premature pull-in or clipping and therefore resulting in a smaller dynamic range of the microphone, depicted in FIGS. 6A and 6B. As the sound wave acting on one of the diaphragm elements 38, 40, causes the diaphragm elements 38, 40 to oscillate which in turn causes the plate capacitor element 42 to oscillate in phase as well, as capacitor element 42 is connected mechanically to diaphragm elements 38, 40 via the spacer. FIGS. 6A and 6B are identical except that in FIG. 6B, the electrode elements 44, 46 are alternated to compromise the curvature formed at the distal ends of the plate capacitor element 48. Coupled to the inner surface of the first diaphragm isolation 45 are electrode elements 44, 46 in proximal to the distal ends of the plate capacitor element 42, respectively. Opposite to the electrode element 44 is the electrode element 46 coupled to the second diaphragm isolation 47. A second set of the electrode element 44 diagonal to the electrode element 44 coupled to the first diaphragm isolation 45 is coupled to the second diaphragm isolation 47. The alternating electrode elements 44, 46 thereby contra the change in gap sensitivity differences as the plate capacitor element 42 oscillates.

Now referring to FIG. 6C, the microphone die is similar to the microphone die of FIGS. 6A and 6B with or without alternating electrode elements arrangement except that the microphone die 330 includes elements 49 buried in the plate capacitor element 42 made from any suitable materials such as oxide or poly-silicon. Forming plate capacitor element 42 with elements 49 buried therein not only reduces the curvature on the distal ends of the plate capacitor element 42 due to stress gradient, the elements 49 buried in the plate capacitor element 42 particularly at the distal ends where curvature exist is counterbalanced. Depending on the curvature direction, the location where the elements 49 is buried can be offset towards upper or lower surface of the plate capacitor element 42. In some embodiments, the thickness of the elements 49 can be tuned or chosen to reduce the curvature.

Figure 7A:
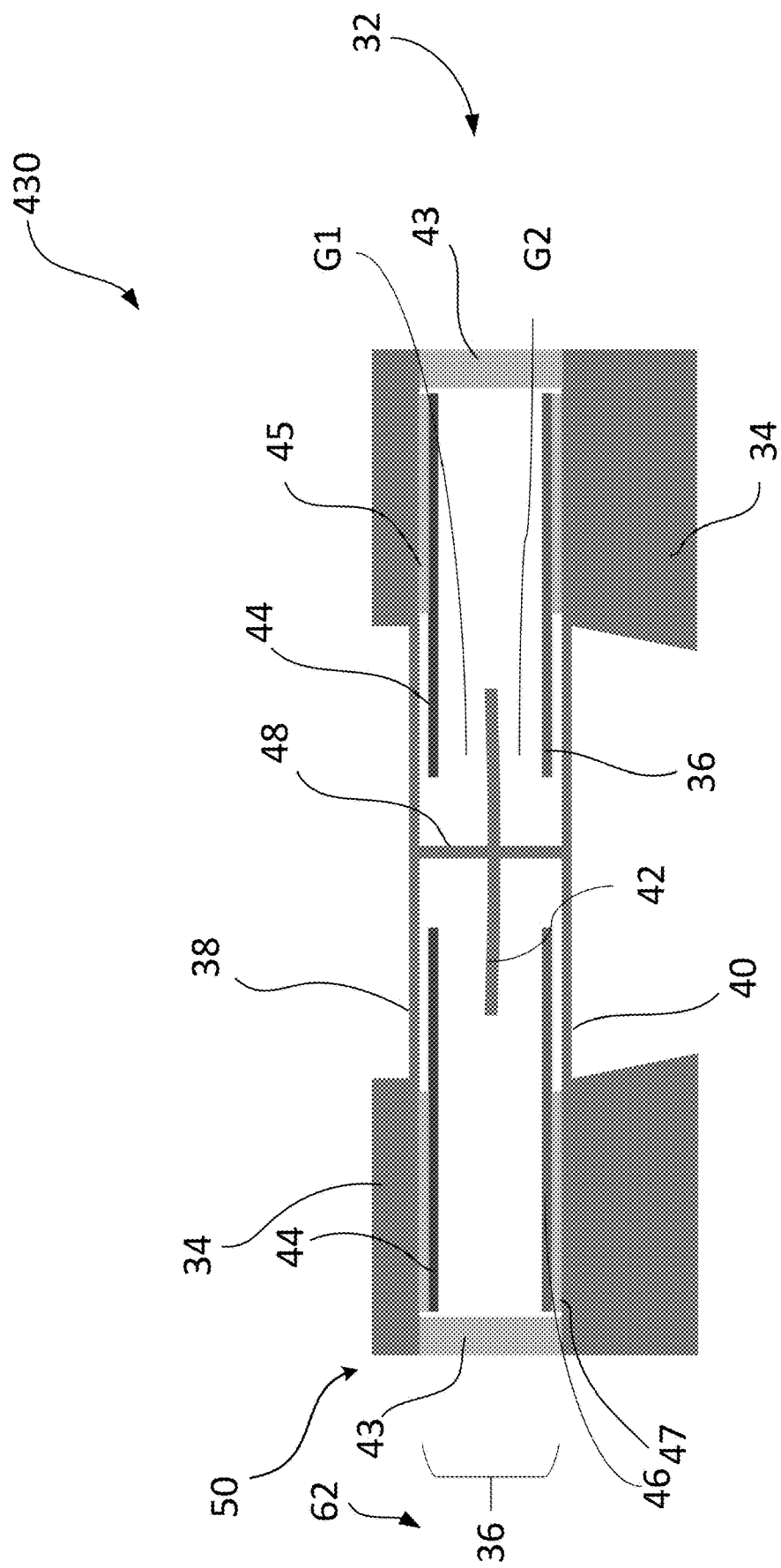
FIG. 7A is a cross-sectional view of a microphone die in accordance with another exemplary embodiment of the disclosure.
Figure 7B:
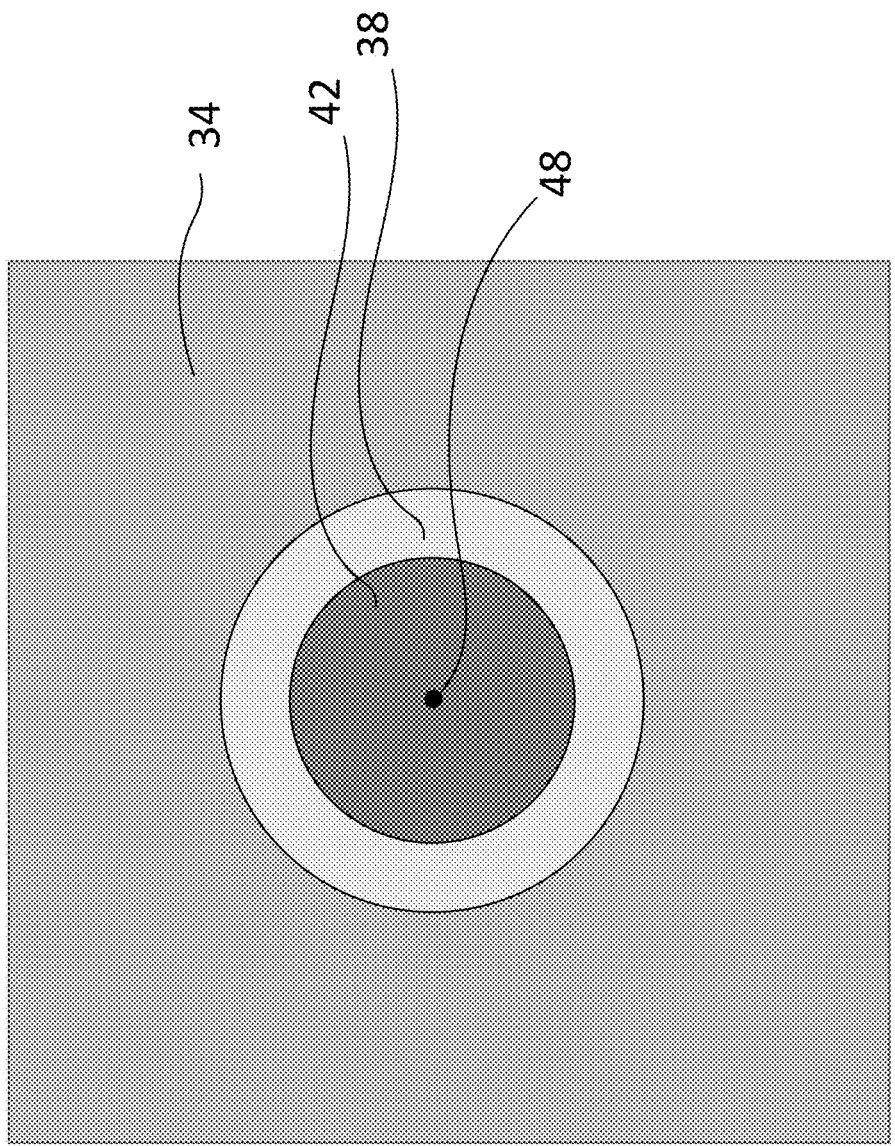
FIG. 7B is a top view of the microphone die of FIG. 7A thereof.

FIGS. 7A and 7B illustrate another microphone die 430 of the disclosure. At least one terminal may be coupled to the microphone die 430 in suitable terminal configuration, as described in previous embodiments. The microphone die 430 is similar to the microphone die 30 illustrated in FIGS. 3A-3C with the exception of the dimension wherein the plate capacitor element 42 has a length substantially shorter than or equal to the length of the diaphragms 38, 40. The isolations 45 and 47 include a length is shorter than or equal to the electrode elements 44, 46. In one embodiment, the isolations 45 and 47 may include a length equal to the plate capacitor element 42. FIG. 7B illustrates a top view of microphone die 430 with the diaphragm 38 having a substantially circular shape. Other shapes like elliptic, triangular, quadratic, rectangular or any other polygon are possible.

Figure 8A:
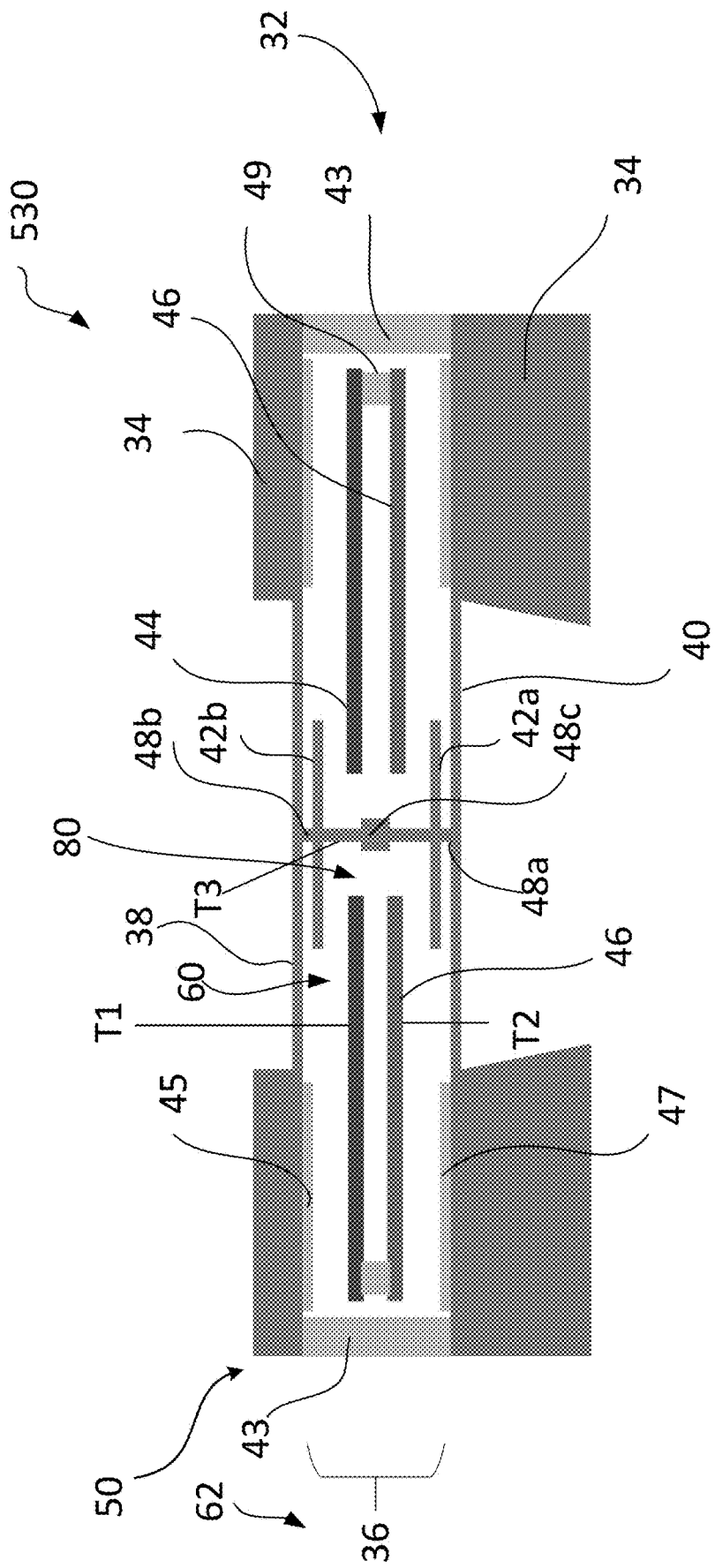
FIG. 8A is a cross-sectional view of a microphone die in accordance with another exemplary embodiment of the disclosure.
Figure 8B:
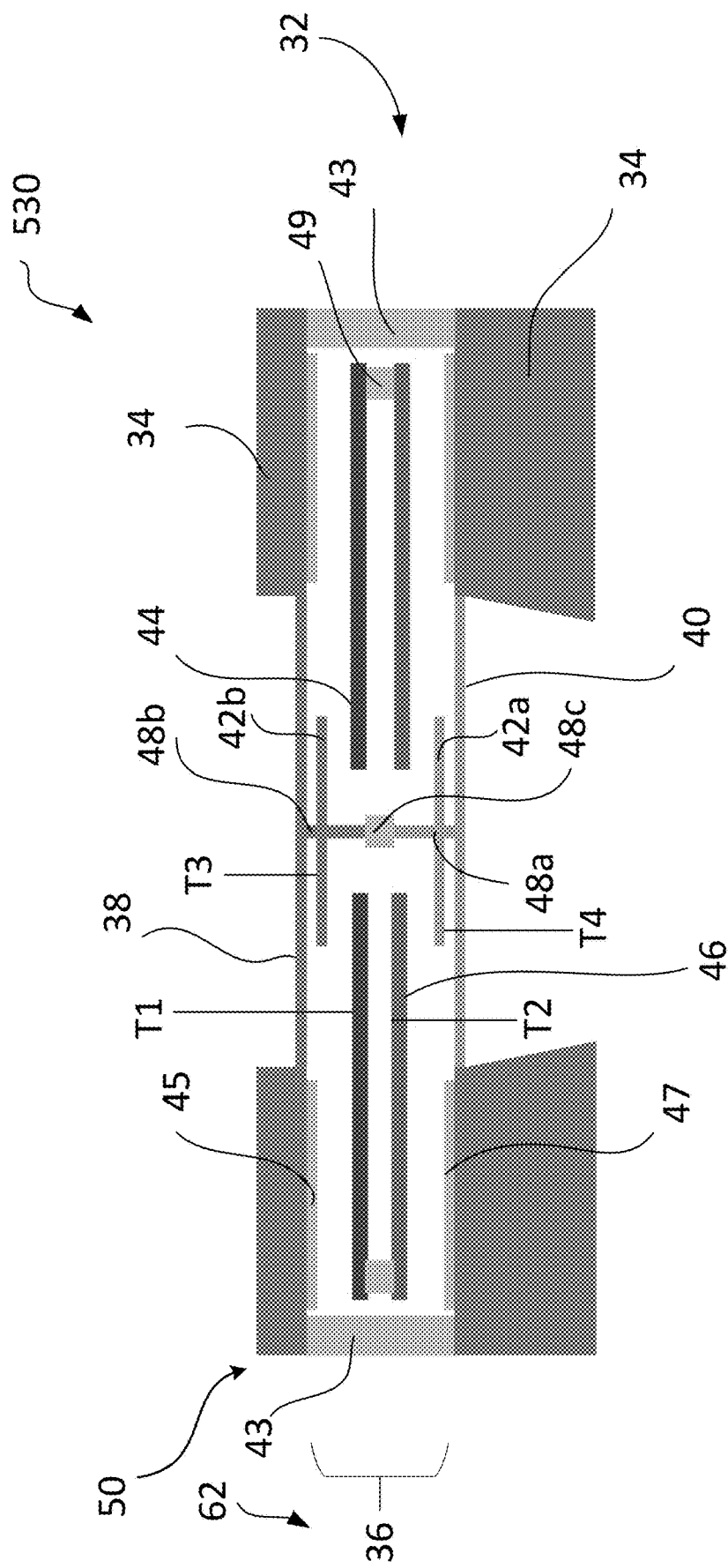
FIG. 8B is a cross-sectional view of a microphone die in accordance with another exemplary embodiment of the disclosure.

FIGS. 8A and 8B illustrate another microphone die 530 having 3- or 4-terminal configuration of the disclosure. The microphone die 530 is similar to the microphone die 230 illustrated in FIGS. 5A and 5B except the microphone die 530 includes dual plate capacitor elements 42a, 42b spaced parted by a pillar 48c. As depicted in FIG. 8A, a second pillar 48b is formed between the first diaphragm element 38 and the plate capacitor element 42a. Similarly, formed between second diaphragm element 40 and the plate capacitor element 42b is a third pillar 48a. The pillar 48c extends through an opening 80 formed within electrode elements 44, 46. Electrode elements 44, 46 are mechanically connected/coupled to the substrate 34 directly or via the spacer 49 that is formed as a portion of the wall structure 43 to keep them in place. The electrode elements 44, 46 are spaced apart by a spacer 49 formed between the electrode elements 44, 46. Depending on the application the spacer is either made of isolating material or of conductive material. In another embodiment, the spacer 49 and the wall structure is formed from a monolithic structure made from either same material or different material for the spacer 49 that is independent from the material used to form the wall structure. Terminal T1 is connected to the electrode element 44. Terminal T2 is connected to the electrode element 46 and terminal T3 is connected to a point in proximal to the pillar 48c of the dual plate capacitor element 42a, 42b. In another embodiment spacer 49 is made of conductive material which electrically connects terminal T1 to terminal T2 resulting in a 2-terminal device electrically similar to FIGS. 4A and 4B.

Now referring to FIG. 8B, the pillar 48c formed between the dual plate capacitor elements 42a, 42b is made of isolating material. Two terminals T1, T2 are connected to the electrode elements 44, 46, respectively. Terminal T3 is connected to the plate capacitor element 42b and terminal T4 is connected to the plate capacitor element 42a. In another embodiment spacer 49 is made of conductive material which electrically connects terminal T1 to terminal T2 resulting in a 3-terminal device electrically similar to FIGS. 3A and 3C.

Figure 9:
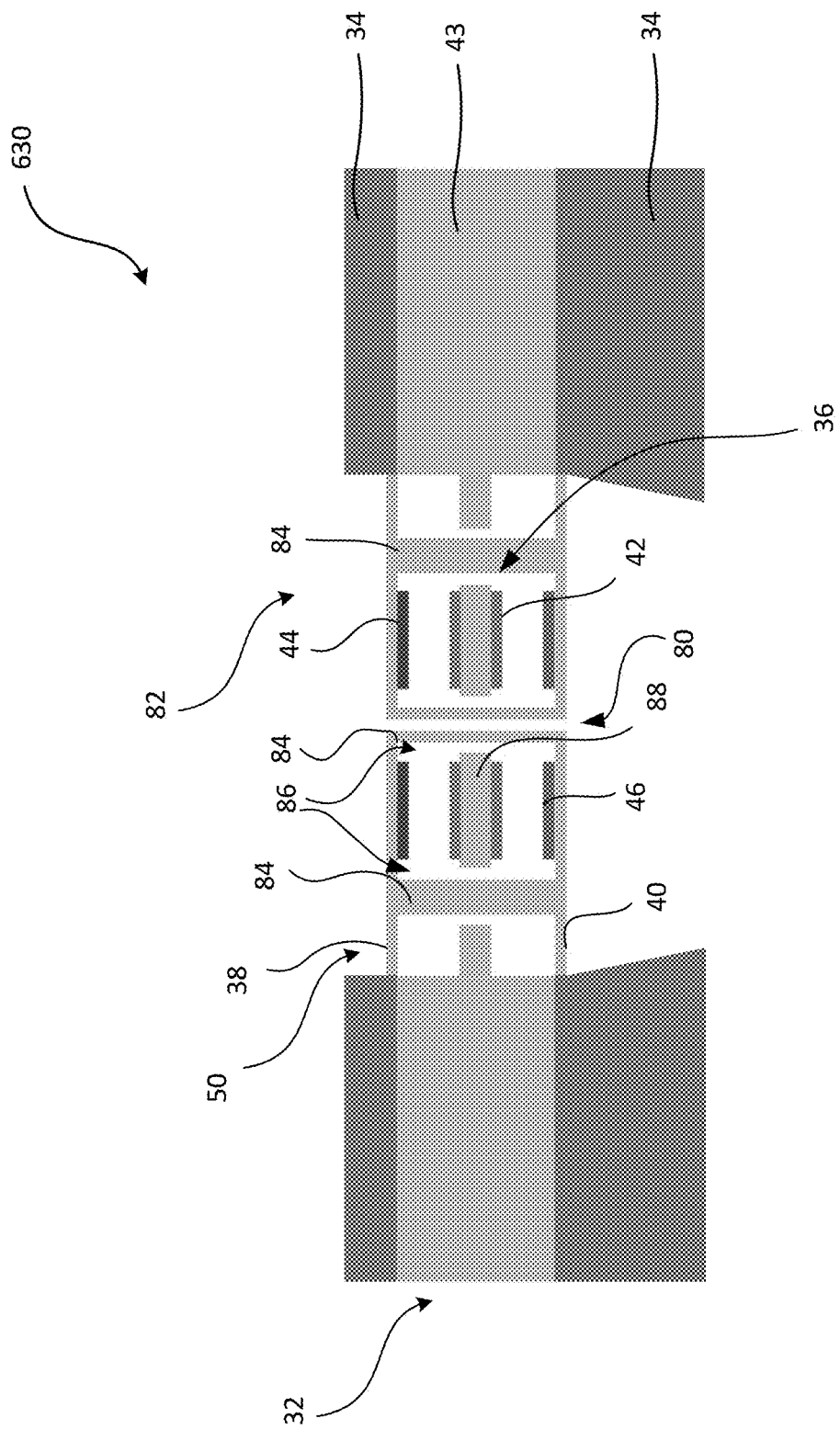
FIG. 9 is a cross-sectional view of a microphone die in accordance with another exemplary embodiment of the disclosure.

FIG. 9 illustrates a cross-sectional view of a microphone die 630 in accordance with an exemplary embodiment of a disclosure. Unlike from the previously illustrated microphone dies, a leak hole 80 is formed within a driving system 32 using any suitable methods. The driving system 32 comprises a carrier 82 having a diaphragm assembly 50 and a wall structure 43 formed as a monolithic structure. Within the carrier 82, more than one pillar 84 is formed to couple top diaphragm 38 to bottom diaphragm 40. At least one of the pillars comprises a through hole defines as the leak hole 80. Depending on the configuration, the microphone die could have more than one leak hole 80 formed within the pillars. The leak hole 80 could be formed by drilling into the pillar 84 to form a single hole. Alternatively, the leak hole 80 could be formed by piercing numerous smaller holes into the pillar 84. In some embodiments, the leak hole 80 can be formed in any location found on the carrier 82, the diaphragm assembly 50, the substrate 34, or combination thereof. Suspended within the top and bottom diaphragms 38, 40 is an intermediate diaphragm 88 having through holes 86 to receive the pillars 84. In one embodiment, the intermediate diaphragm 88 is less flexible than the other diaphragms 38, 40. In some embodiments, the stiffness contribution may be attributed to at least one of choices including thickness, diameter choice, opening, material, stress, and so forth. As illustrated in FIG. 9, a plate counter electrode assembly 36 is confined within any two pillars 84 and carried by the carrier 82. In one embodiment, top and bottom electrodes 44, 46 are suspended to the top and bottom diaphragms, respectively. Intermediate electrodes 42, two electrodes are illustrated, are mounted to top and bottom surfaces of the intermediate diaphragm 88. As an example, vias is formed within the intermediate diaphragm 88 and is used to connect the top electrode 42 to the bottom electrode 42. In another example, the top electrode 42 and bottom electrode 42 could be printed as traces and then attached it to or integrated into the intermediate diaphragm 88.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the spirit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A Microelectromechanical system (MEMS) microphone, comprising:
a base unit;
a driving system disposed on the base unit, the driving system comprising:
a carrier;
a wall structure mechanically coupled to the carrier and to the base unit; and
a plate counter electrode assembly mechanically coupled to the carrier, wherein
the wall structure and the carrier defining a sealed electrode region and the plate counter electrode assembly is disposed within the sealed electrode region and spaced apart from the wall structure, and the plate counter electrode assembly comprises a first movable electrode member and a second movable electrode member, and the first and second movable electrode members are substantially made of a material having a conductivity.

2. The MEMS microphone of claim 1 wherein the carrier comprises a first and second diaphragm, and the first and second diaphragms are substantially made of an insulating material.

3. The MEMS microphone of claim 1 wherein the first and second movable electrode members are mechanically coupled to the first and second diaphragm.

4. The MEMS microphone of claim 2 wherein one or more of the diaphragms are substantially made of a material having a tensile residual stress.

5. The MEMS microphone of claim 1 wherein the plate counter electrode assembly comprises a material having a tensile residual stress.

6. The MEMS microphone of claim 3 further comprising one or more pillar formed within the driving system.

7. The MEMS microphone of claim 6 further comprising a leak hole formed through at least one of the pillar.

8. A driving system for a Microelectromechanical system (MEMS) microphone comprising:
 a carrier comprising:
  a first diaphragm;
  a second diaphragm spaced apart from the first diaphragm; and
  a gap formed between the first and second diaphragm;
 a plate counter electrode assembly formed within the first and second diaphragms, the plate counter electrode assembly comprising:
  a moving electrode member; and
  at least two counter electrode members; and
 a wall structure mechanically coupled to the two counter electrode members and to the first and second diaphragms and defining a sealed electrode region;
 wherein the sealed electrode region has an encapsulated gas pressure and the plate counter electrode assembly is disposed within the sealed electrode region.

9. The driving system of claim 8 wherein the first diaphragm is substantially made of a material having a low conductivity and the second diaphragm is substantially made of an insulating material.

10. The driving system of claim 8 wherein the movable electrode member is substantially made of a material having a conductivity.

11. The driving system of claim 9 wherein one or more of the first and the second diaphragms are substantially made of a material having a tensile residual stress.

12. The driving system of claim 8, the plate counter electrode assembly comprising a material having a tensile residual stress.

13. The driving system of claim 12 wherein the plate counter electrode assembly comprises at least two counter electrodes formed within the sealed electrode region.

14. The driving system of claim 8 further comprising a connecting member mechanically coupling the counter electrode assembly to the first and second diaphragms.

15. The driving system of claim 14 further comprising a leak hole formed through the connecting member.

16. The driving system of claim 11 further comprising one or more pillar formed within the driving system.

17. The driving system of claim 16 further comprising a leak hole.

18. The driving system of claim 17 wherein the leak hole is formed through at least one of the one or more pillar.

* * * * *